United States Patent [19]
Staerzl

[11] Patent Number: 5,747,892
[45] Date of Patent: May 5, 1998

[54] GALVANIC ISOLATOR FAULT MONITOR

[75] Inventor: Richard E. Staerzl, Fond du Lac, Wis.

[73] Assignee: Brunswick Corporation, Lake Forest, Ill.

[21] Appl. No.: 779,930

[22] Filed: Jan. 6, 1997

[51] Int. Cl.$^6$ ..................... H01B 7/28
[52] U.S. Cl. .............. 307/95; 439/938.1; 204/196; 204/197; 320/48
[58] Field of Search ............... 307/95; 439/938.1; 204/196, 197; 320/48; 324/71.2, 425

[56] References Cited

U.S. PATENT DOCUMENTS

| | | | |
|---|---|---|---|
| 3,853,730 | 12/1974 | Anderson . | |
| 3,953,742 | 4/1976 | Anderson et al. | 204/196 |
| 4,061,965 | 12/1977 | Nelson | 204/197 |
| 4,090,170 | 5/1978 | Lincklaen-Arriens et al. | 307/95 |
| 4,322,633 | 3/1982 | Staerzl . | |
| 4,492,877 | 1/1985 | Staerzl . | |
| 4,528,460 | 7/1985 | Staerzl . | |
| 4,872,860 | 10/1989 | Meisenburg . | |
| 5,138,543 | 8/1992 | Harm et al. | 363/21 |
| 5,627,414 | 5/1997 | Brown et al. | 307/95 |

OTHER PUBLICATIONS

"Everything You Need to Know About Propellers", pp. 51–52, 4th Ed. Brunswick Corp., P/N 90–861244–92.

*Primary Examiner*—Richard T. Elms
*Assistant Examiner*—Albert W. Paladini
*Attorney, Agent, or Firm*—Andrus, Sceales, Starke & Sawall

[57] ABSTRACT

A system and method for testing and monitoring the operation of a galvanic isolator. The galvanic isolator is positioned between shore ground and boat ground to prevent the flow of destructive galvanic currents between the shore ground and the boat ground. The monitoring system transmits a test current through the galvanic isolator at specific time intervals to test the effectiveness of the galvanic isolator. The monitoring system includes a first counter that outputs an enabling signal after a desired period of time. The enabling signal allows a test current to flow through the galvanic isolator for a brief period of time determined by a second counter. As the test current flows through the galvanic isolator, a current sensing circuit measures the test current and activates an alarm if the test current flowing through the galvanic isolator falls outside a predetermined range. In this manner, the monitoring system of the invention monitors and periodically tests a galvanic isolator.

23 Claims, 2 Drawing Sheets

GALVANIC ISOLATOR FAULT MONITOR

BACKGROUND OF THE INVENTION

This invention relates to a galvanic isolator which is placed between boat ground and shore ground to prevent corrosion of a submersible metal marine drive. More particularly, the invention is a monitor that periodically tests the galvanic isolator to determine whether the galvanic isolator is operating properly.

The leading cause of corrosion damage in a marine propulsion system is galvanic corrosion (i.e., electrochemical interaction between dissimilar metals). Galvanic corrosion is most prevalent when marine drives, both outboard motor and stern drives, are immersed in salt water, brackish water, or other waters having high conductivity caused by pollution. In the process, one of the dissimilar metals is eaten away. Often it is the aluminum housing of the lower unit that suffers from corrosive deterioration. This damaging corrosion can be eliminated by providing a sacrificial metal anode—such as zinc or aluminum—that corrodes preferentially to protect the aluminum in the lower unit, or by installing a direct current corrosion prevention system on the boat, such as a Quicksilver MerCathode® system. Direct current protection systems impart a DC current on a permanent anode mounted to the boat transom below the water level to create a protective polarization for the aluminum in the lower unit (the cathode) to retard corrosion. The DC power source must have the positive side coupled to the anode and the negative side coupled to the aluminum lower unit being protected from corrosion. By maintaining the permanent anode at an appropriate potential, a small DC current is supplied to the lower unit to maintain a protective polarization thereon and essentially prevent galvanic corrosion.

While sacrificial anodes and DC current protection systems are normally effective to prevent corrosion of the lower unit, these systems can be inadequate to prevent galvanic corrosion when a boat is plugged into shore power. When a docked boat is plugged into a source of shore power, destructive galvanic corrosion currents can flow from the lower unit of the marine drive through the boat ground to the shore ground, thus exacerbating galvanic corrosion. To solve this problem, a galvanic isolator can be installed between the shore ground and boat ground to block the passage of galvanic DC currents, while still providing a path to ground for dangerous AC fault currents.

FIG. 2 shows a prior art galvanic isolator that includes two pair of diodes with one pair of the diodes biased in the forward direction between boat ground and shore ground, and a second pair of diodes biased in the reverse direction. Also connected in parallel with each pair of diodes is a capacitor. In the configuration shown in FIG. 2, the diodes prevent the passage of galvanic DC current between boat ground and shore ground until the forward or reverse voltage between the boat ground and shore ground reaches approximately 1.4 volts, which is the sum of the voltage drop across the diode pair required to turn on each pair of diodes. Typically, galvanic voltage differences between dissimilar metals is approximately 1 volt DC, so the galvanic isolator shown in FIG. 2 effectively prevents corrosion while still providing a path to ground for dangerous fault (shock) currents.

The galvanic isolator shown in FIG. 2 effectively blocks galvanic corrosion currents that are caused by the presence of dissimilar metals in the water. While this system is effective to prevent galvanic corrosion when connected correctly, the isolator itself does not provide an indication as to whether or not it is operating properly. A monitoring system that tests the galvanic isolator and indicates whether the isolator is operating properly is a desirable feature.

BRIEF SUMMARY OF THE INVENTION

The invention is a method and system for monitoring the operation of a galvanic isolator that prevents the flow of a galvanic current between shore ground and boat ground when a boat is plugged into a source of shore power. The method and system of the invention periodically tests whether the galvanic isolator is operating properly and provides an alarm signal to the boat user should the galvanic isolator fail.

The monitoring system of the invention comprises a timing circuit which is coupled to the source of shore power. Since the shore power is typically an AC value, the timing circuit counts the number of cycles of the shore power supply. After reaching a desired count value, the timing circuit outputs an enable signal to a test current supply circuit. Upon receipt of the enable signal, a test current supply circuit allows a limited amount of test current to flow from the shore power supply through the galvanic isolator to shore ground. The timing circuit includes a second counter that generates a disable signal to the test current supply circuit a brief period of time after the enable signal to prevent any further test current from flowing through the galvanic isolator. Thus, a test current is sent through the galvanic isolator for only a brief test interval.

A current sensing circuit is positioned between the galvanic isolator and shore ground to determine the amount of test current flowing from the galvanic isolator to shore ground. The sensed amount of test current is then compared to a predetermined acceptable range. If the sensed test current is outside of the acceptable range, the current sensing circuit activates an alarm to indicate that the galvanic isolator is operating improperly.

In another feature of the invention, the monitoring system includes an inhibitor which prevents the test current from being supplied to the galvanic isolator when an actual fault current is flowing through the galvanic isolator.

In yet another feature of the invention, the monitoring system includes an alarm inhibitor connected between the timing circuit and the alarm. The alarm inhibitor prevents the alarm from being sounded during normal operation of the galvanic isolator. During the test interval, the alarm inhibitor is effectively removed from the monitoring system, thereby allowing the alarm to be activated if the galvanic isolator is operating improperly.

Various other features, objects, and advantages of the invention will be made apparent from the following detailed description and the drawings.

BRIEF DESCRIPTION OF THE SEVERAL VIEWS OF THE DRAWINGS

The accompanying drawings illustrate the best mode presently contemplated by the inventor for carrying out the invention.

In the drawings.

DETAILED DESCRIPTION OF THE INVENTION

Figure 1:
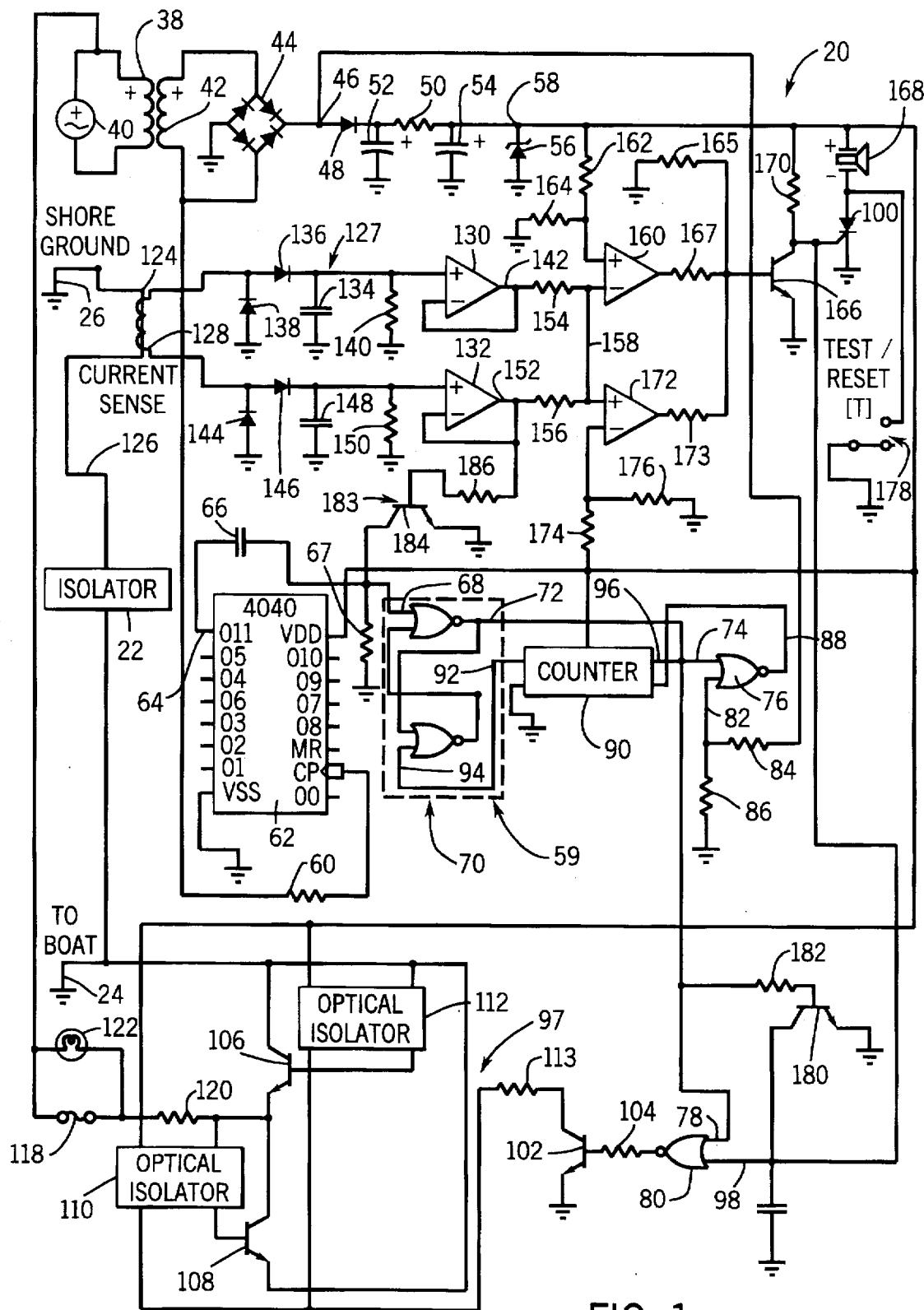
FIG. 1 is a schematic circuit diagram of the galvanic isolator fault monitor according to the invention.

A galvanic isolator monitoring circuit in accordance with the invention is shown in FIG. 1 and is generally referred to by reference numeral 20. The monitoring circuit 20 generally monitors and tests the operation of a galvanic isolator 22 placed in series between the boat ground 24 and the shore ground 26. The galvanic isolator 22 blocks destructive corrosion currents that are caused by the presence of dissimilar metals in the water. For example, the shore ground 26 could be connected to a steel dock or similar structure, while the boat ground 24 is typically connected to the aluminum housing of the submerged marine propulsion unit.

Figure 2:
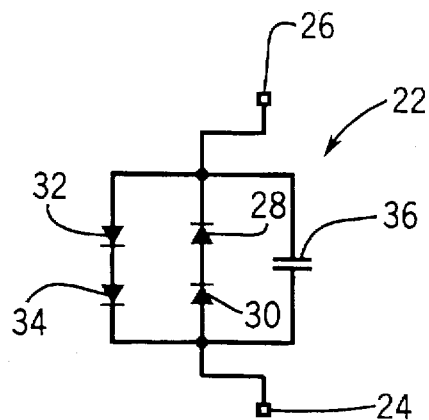
FIG. 2 is a schematic circuit diagram of a prior art galvanic isolator.

Referring now to FIG. 2, a typical galvanic isolator 22 is thereshown. The galvanic isolator 22 includes a pair of forward biased diodes 28,30 and a pair of reverse biased diodes 32,34. The diode pairs are connected in parallel between the boat ground 24 and the shore ground 26. As is well known, each of the diodes 28, 30, 32 and 34 has a voltage drop of approximately 0.7 volts and requires a voltage difference of approximately 0.7 volts between the anode and the cathode to allow current to flow through the diode. Therefore, each pair of diodes shown in FIG. 2 blocks galvanic corrosion currents from flowing therethrough until there is approximately a 1.4 voltage difference between the boat ground 24 and the shore ground 26. Since the typical galvanic voltage is in the approximate range of 1.0 volt, the galvanic isolator 22, shown in FIG. 2, is effective in blocking destructive galvanic current.

A capacitor 36 is connected in parallel between boat ground 24 and shore ground 26. The capacitor 36 eliminates AC fault current from passing between the shore ground 26 and the boat ground 24, for example when a leakage or fault current is present due to a failure in the system. The galvanic isolator shown in FIG. 2 provides an effective method of isolating the lower gear case of a marine propulsion unit from galvanic corrosion. While the galvanic isolator 22 shown in FIG. 2 effectively prevents harmful galvanic corrosion when connected between the boat ground 24 and shore ground 26, the galvanic isolator 22 fails to alarm the boat user when the galvanic isolator 22 is not operating properly. A monitoring circuit 20 in accordance with the invention periodically tests the galvanic isolator 22 to ensure that the isolator 22 is operating properly, and preferably alarms the boat user if the galvanic isolator 22 is not operating properly.

Referring again to FIG. 1, a monitoring circuit 20 in accordance with the invention is connected through a step down transformer 38 to a shore power supply 40. In the preferred embodiment of the invention, the shore power supply 40 is a source of 110 volt AC power. The step down transformer 38 reduces the shore power 40 to approximately 10 volts on the secondary winding 42. The secondary winding 42 is connected to a voltage rectifier 44. The rectified voltage at node 46 is fed through a conventional filter network having diode 48, resistor 50 and a pair of capacitors 52 and 54. Zener diode 56 regulates the voltage value at node 58 to approximately 9.1 volts.

The voltage from the secondary winding 42 of step down transformer 38 is fed to timing circuit 59. Specifically, secondary winding 42 is connected through resistor 60 to a clock pulse pin of a first counter 62. The counter 62 is a standard component, such as Model No. 4040, sold by Motorola, where manufacturer-assigned pin number designations are shown to facilitate understanding. Since the voltage on the secondary coil 42 is an AC value, the first counter 62 counts the number of transitions between the positive half cycle and the negative half of the voltage on the secondary winding 42. The first counter 62 is configured to count the number of transitions until the count reaches a maximum count value. In the preferred embodiment of the invention, the first counter 62 is configured to reach the maximum count value in approximately 68 seconds, based on the shore power supply 42 being 60 Hertz.

Once the first counter 62 reaches the maximum count value, the first counter 62 outputs a high signal pulse on pin 64. The high signal pulse at pin 64 is transmitted through capacitor 66 and develops a voltage across resistor 67, which is fed into a set input 68 of a conventional flip-flop 70 contained in timing circuit 59. Upon receiving a high input pulse at set terminal 68, the flip flop 70 outputs a low signal pulse at output 72. This low signal at output 72 is fed both to input 74 of NOR gate 76 and to input 78 of NOR gate 80.

Figure 4:
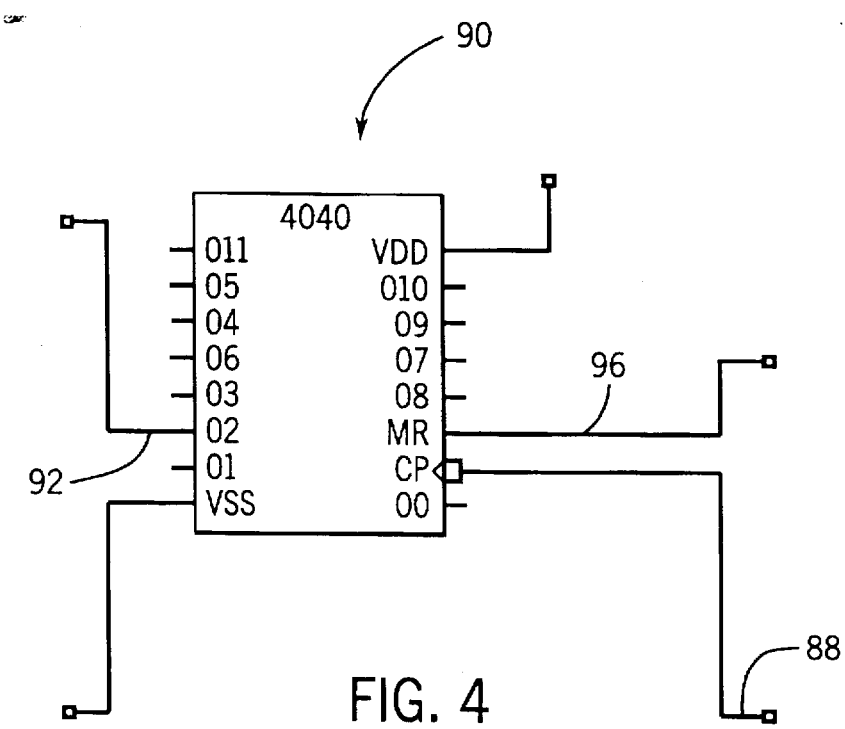
FIG. 4 is a schematic circuit diagram of the counter shown in FIG. 1.

The second input 82 of NOR gate 76 is connected to the rectified voltage at node 46 through the resistor network having resistors 84 and 86. The NOR gate 76 receives a series of pulses at input 82 from the node 46. Thus, when the first input 74 is low, the output 88 of NOR gate 76 toggles between high and low as the voltage at node 46 varies. The output 88 of NOR gate 76 is fed to a second counter 90 that counts the positive to negative transitions of shore power supply 40. In the preferred embodiment of the invention, the second counter 90 in timing circuit 59 is a standard component sold under Model No. 4040, sold by Motorola, where manufacturer-assigned pin number designations are shown to facilitate understanding. The configuration of the second counter 90 is shown in detail in FIG. 4. The output 88 of NOR gate 76 is fed into the clock pulse pin of the second counter 90. The second counter 90 is configured so that upon receiving two pulses from NOR gate 76, the counter 90 outputs a high pulse on pin 92. Since the output 88 of NOR gate 76 corresponds to the pulses at node 46, which is a rectified signal, the second counter 90 counts both the positive half cycle and the negative half cycle of the sine wave input voltage 40.

Upon counting two pulses, the output at pin 92 goes high and is fed into the reset input 94 of the flip-flop 70. The high signal at the reset pin 94 resets the flip-flop 70 and results in a high signal at output 72. This high signal at output 72 is then fed into the reset pin 96 (FIG. 4) of the second counter 90 which resets the counter 90. Additionally, the high signal at output 72 of flip flop 70 is fed to input 74 of NOR gate 76, thereby causing output 88 to remain low. Thus, the second counter 90 does not begin its two-count until flip-flop 70 again receives a high signal at input 68 from the first timer 62.

Figure 3:
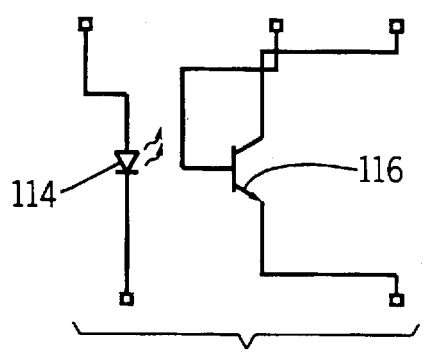
FIG. 3 is a schematic circuit diagram of the optical isolator shown in FIG. 1.

As can be understood by the preceding discussion, the timing circuit 59, provided by first counter 62, flip-flop 70, second counter 90 and the related components, outputs a low enable signal at output 72 for only a brief interval. During the brief period of time when a low signal is present at output 72 of flip-flop 70, this low value is fed to a test current supply circuit 97. Specifically, the low signal at output 72 is fed to input 78 of the NOR gate 80. The second input 98 of the NOR gate 80 is also low, since the second input 98 is effectively connected to ground while the SCR 100 is turned off, to be described in detail below. Therefore, the NOR gate 80 will output a high signal that is applied to the base of transistor 102 through resistor 104. A high signal at the output of NOR gate 80 turns the transistor 102 on. When the transistor 102 is turned on, the transistor 102 turns on a pair of power transistors 106 and 108 through a pair of optical isolators 110 and 112. When transistor 102 is "on", current flows from the optical isolators 110 and 112 through current limiting resistor 113 and to ground through transistor 102. A detailed circuit diagram of the optical isolators 110 and 112 is shown in FIG. 3. As can be seen in FIG. 3, each of the optical isolators 110,112 includes a light emitting diode 114 and a receiving transistor 116, such that when current flows through the light emitting diode 114, transistor 116 is turned on by the receipt of the optical signal.

When the power transistors 106 and 108 of the test current supply circuit 97 are turned on, a supply of current flows from the shore power supply 40 through fuse 118 and through current limiting resistor 120. An indicator light 122 is positioned across fuse 118 such that should fuse 118 fail, the indicator light 122 will indicate such a failure. During the positive half cycle of the shore power supply 40, test current flows through power transistor 108 and into the isolator 22. Likewise, during the negative half cycle of the shore power supply 40, test current flows through power transistor 106 and through the isolator 22. The optical isolators 110 and 112 of the test current supply circuit 97 are used to isolate the remaining portions of the circuit from the high current value flowing through the power transistors 106 and 108. Typically, the amount of test current flowing therethrough is in the range of 10 amps. This 10 amp test current is sent through the galvanic isolator 22 for one complete cycle of the shore power supply 40.

The test current sent through the galvanic isolator 22 then travels through wire 126 to the current sensing circuit 127. Current sensing circuit 127 includes a toroid 124 having an outer winding 128 surrounding the wire 126 leading from the isolator 22 to the shore ground 26. A current is induced in the outer winding 128 of the toroid 124 based on the amount of current flowing through the wire 126. The current induced in winding 128 is fed into a pair of buffer amplifiers 130 and 132 in the current sensing circuit 127. Buffer amplifier 130 has a non-inverting input connected to capacitor 134 and to a pair of diodes 136 and 138. During the positive half-cycle of the shore voltage supply 40, current is fed into resistor 140 to create a voltage present at output 142 of buffer amplifier 130. During the negative half-cycle of the shore voltage 40, the current flows through an identical circuit having diodes 144 and 146 to charge capacitor 148, and fed through resistor 150 to create a voltage at output 152 of buffer amplifier 132.

The voltages at output 142 and output 152 are summed through resistors 154 and 156 and common line 158. This combined voltage value at 158 is fed into the inverting terminal of comparator 160, which compares the value at 158 to an upper reference limit at the non-inverting terminal. The upper reference limit is provided by a voltage divider having resistors 162 and 164. If the voltage value at the inverting terminal of comparator 160 is below the desired limit, comparator 160 will output a high value to the base of transistor 166, through a voltage divider having resistors 165 and 167 which maintains the transistor 166 in an "on" condition. When the transistor 166 is on, the gate of SCR 100 is essentially held at ground which creates an open circuit between alarm 168 and ground to prevent the alarm 168 from operating. Although the circuit 20 has been shown as including a horn as alarm 168, any other indicating means such as a light or similar device can be used.

If the combined output of buffer amplifiers 130 and 132 becomes too high, such as if the galvanic isolator 22 is not working properly, to be described, the comparator 160 will output a low signal that turns "off" transistor 166. When the transistor 166 is turned off, a high value of voltage is supplied to the gate of SCR 100 through resistor 170 to turn on SCR 100. When the SCR 100 is turned on, voltage is applied across the alarm 168 which causes the alarm 168 to activate, thereby indicating a problem in the isolator 22.

Comparator 172 serves as the lower limit comparator. The common voltage at point 158 is supplied to the non-inverting terminal of the comparator 172. A lower limit reference voltage set by resistors 174 and 176 is supplied to the inverting terminal of the comparator 172. During normal operations, the voltage value at 158 exceeds the lower limit reference voltage and the comparator 172 outputs a high signal through a voltage divider having resistors 165 and 173 to keep transistor 166 "on", which inhibits the horn 168, as previously discussed. Should the voltage at 158 drop below the reference voltage on the inverting terminal of comparator 172, the comparator 172 will output a low signal through resistor 173 which turns "off" the transistor 166. When the transistor 166 is turned off, SCR 100 is turned on which activates the alarm 168, as previously described.

A push button 178 is connected to the alarm 168 so that a user can selectively depress the push button 178 and test the operation of alarm 168. Additionally, the push button 178 serves as a reset for the SCR 100. Once the SCR 100 is turned on and the alarm 168 activated, the alarm 168 will remain activated until the push button 178 is depressed. Push button 178 provides a path to ground, which turns off SCR 100, thereby resetting alarm 168.

As can be understood by the preceding description, the current sensing circuit 127 turns off the transistor 166 only when the current through the windings 128 of toroid 124 creates a voltage that is either above or below a set voltage limit. When the voltage of 158 is outside of the set voltage range, it is an indication that the galvanic isolator 22 is operating improperly.

When transistor 166 is turned off by current sensing circuit 127, indicating an improperly acting isolator 22, a high value is applied to input terminal 98 of NOR gate 80. If input terminal 98 is high, the output of NOR gate 80 will be low, thus turning off transistors 102, 106, and 108. When the transistors 102, 106 and 108 are turned off, the test current is no longer applied through the galvanic isolator 22. Therefore, the NOR gate 80 provides additional circuit protection, so that test current is not sent through the galvanic isolator 22 should the galvanic isolator 22 be operating improperly. This is desirable because transmitting test current through an improperly operating galvanic isolator 22 should be avoided.

During normal operating conditions, the test current is sent through galvanic isolator 22 at specific intervals determined by the timing circuit 59. As previously discussed, in the preferred embodiment of the invention, a test current is sent through galvanic isolator 22 at approximately 68 second intervals as determined by the first counter 62. When the galvanic isolator 22 is not being tested by circuit 20, it is desirable that the horn 168 not be operable, since horn 168 would be triggered when no fault current or test current is present.

During non-testing operating conditions, the output 72 of flip-flop 70 is high. This high output is connected to the base of transistor 180 through a current limiting resistor 182. The high value at output 72 turns on transistor 180 which effectively connects the gate of SCR 100 to ground, thereby inhibiting horn 168. When the flip-flop 70 is set, a low output is present at output 72 and thus transistor 180 is turned off, thereby effectively removing transistor 180 from the circuit and allowing the horn 168 to be operated as previously discussed.

Additionally, it is desirable that a test current not be sent through the monitoring circuit 20 when a fault current is passing through isolator 22, since the test current would be added to the fault current, a combination of which should be avoided. This feature is accomplished by a test current supply circuit inhibitor 183, the operation of which is as follows. During non-testing operating conditions, if a fault current is present, a current will be induced in the windings 128 of toroid 124. This induced current will result in a voltage being present at output 152 of buffer amplifier 132 in a manner as previously discussed. Output 152 of buffer amplifier 132 is connected to transistor 184 through a current limiting resistor 186. The voltage at 152 will turn on transistor 184, thus shorting out the input terminal 68 of flip-flop 70 through the transistor 184. Grounding of input terminal 68 prevents toggling of thus preventing t 72, thus preventing current from flowing through transistors 106 and 108.

It is recognized that various equivalents, alternatives and modifications are possible within the scope of the appended claims, and that the invention may be used with other types of galvanic isolators, for example as shown in commonly owned co-pending U.S. application Ser. No. 08/747,259, filed Nov. 11,1996.

I claim:

1. A monitor for a galvanic isolator that protects a submersible metal marine propulsion unit from corrosion, the monitor comprising:

a test current supply circuit for supplying a test current to the galvanic isolator;

a current sensing circuit for sensing the amount of test current passing through the galvanic isolator; and an alarm in communication with the current sensing circuit, the alarm providing a detectible output when the test current passing through the galvanic isolator is outside an acceptable range.

2. The monitor of claim 1 wherein the alarm is connected to an SCR, such that when the SCR is energized, the alarm is activated.

3. The system of claim 1 further comprising an alarm inhibitor in communication with the alarm to disable the alarm when a test current is not present.

4. The monitor of claim 1 further comprising a test current supply circuit inhibitor in communication with the test current supply circuit, the inhibitor preventing a test current from being supplied to the galvanic isolator when current is already being received by the galvanic isolator.

5. A monitoring system for monitoring and testing a galvanic isolator that protects a submersible metal marine propulsion unit from corrosion, the monitoring system comprising:

a timing circuit for generating an enable signal at specific time intervals during operation of the monitoring system;

a test current supply circuit in communication with the timing circuit, the test current supply circuit supplying a test current to the galvanic isolator upon receiving the enable signal from the timing circuit;

a current sensing circuit sensing the test current passing through the galvanic isolator, and comparing the test current passing through the galvanic isolator to an acceptable range; and an alarm in communication with the current sensing circuit, the alarm providing a detectable output when the test current passing through the galvanic isolator is outside the acceptable range.

6. The system of claim 5 further comprising a test current supply circuit inhibitor in communication with the timing circuit, the inhibitor preventing a test current from being supplied to the galvanic isolator when a fault current is being received by the galvanic isolator.

7. The system of claim 5 wherein the alarm is an audible alarm.

8. The system of claim 5 wherein the timing circuit comprises a first counter that generates the enable signal to supply the test current, and a second counter that generates a disable signal after the generation of the enable signal to terminate the supply of test current.

9. The system of claim 5 further comprising an alarm inhibitor in communication with the alarm to disable the alarm when a test current is not present.

10. The system of claim 5 wherein the current sensing circuit includes a first and a second comparator, the first comparator comparing the test current from the galvanic isolator to a high limit, and the second comparator comparing the test current from the galvanic isolator to a lower limit.

11. The system of claim 5 wherein the current sensing circuit includes a toroid surrounding the connection between the galvanic isolator and shore ground, such that the current sensing circuit indirectly senses the test current between the galvanic isolator and the shore ground.

12. A monitoring system for monitoring and testing a galvanic isolator that protects a submersible metal marine propulsion unit from corrosion, the monitoring system comprising:

a timing circuit for generating an enable signal for a testing time interval during operation of the monitoring system, the timing circuit having a first counter, a second counter, and a flip-flop, the first counter setting the flip-flop to begin generation of the enable signal, the second counter resetting the flip-flop after generation of the enable signal to terminate the enable signal;

a test current supply circuit in communication with the timing circuit, the test current supply circuit applying a test current to the galvanic isolator during the testing time interval when the timing circuit is generating the enable signal;

a current sensing circuit for sensing the test current passing through the galvanic isolator, the current sensing circuit including a first and a second comparator, the first comparator comparing the test current through the galvanic isolator to a high limit, and the second comparator comparing the test current through the galvanic isolator to a low limit;

an alarm in communication with the current sensing circuit, the alarm providing a detectible output when the test current passing through the galvanic isolator exceeds the high limit or is below the low limit;

a test current supply circuit inhibitor in communication with the test current supply circuit, the inhibitor preventing the test current from being supplied to the galvanic isolator when current is already being received by the galvanic isolator; and an alarm inhibitor in communication with the alarm to disable the alarm when a test current is not present.

13. The monitoring system of claim 12 wherein the test current supply circuit includes a pair of optical isolators and a pair of transistors for supplying test current to the galvanic isolator; and wherein test current supply circuit inhibitor is positioned between the current sensing circuit and the flip-flop to prevent the flip-flop from being set when current is being received by the galvanic isolator.

14. A method of monitoring and testing a galvanic isolator that protects a submersible metal marine propulsion unit from corrosion, the method comprising the steps of:

supplying a test current to the galvanic isolator only during a periodic test interval;

comparing the amount of test current that passes through the galvanic isolator during the test interval to an acceptable range; and activating an alarm if the amount of test current that has passed through the galvanic isolator is outside of the acceptable range, thereby indicating the galvanic isolator is operating improperly.

15. The method of claim 14 further comprising the steps of continuously determining whether current is flowing through the galvanic isolator and preventing the supply of test current to the galvanic isolator upon a determination that current is flowing through the galvanic isolator.

16. The method of claim 14 further comprising the step of inhibiting the alarm at times other than during the test interval, thereby preventing the alarm from being activated during normal operation of the galvanic isolator.

17. The method of claim 14 further comprising the step of indirectly measuring the amount of test current flowing between the galvanic isolator and a shore ground.

18. The method of claim 17, wherein the indirect current measurement includes a toroid surrounding the wire connecting the galvanic isolator and shore ground.

19. The method of claim 14 further comprising the steps of counting the number of cycles of a shore power supply and supplying test current for the test interval upon reaching a predetermined count value.

20. The method of claim 19 wherein the test interval is one cycle of the shore power supply.

21. A method of monitoring and testing a galvanic isolator that protects a submersible metal marine propulsion unit from corrosion, the method comprising the steps of:

counting the number of cycles of a shore power supply;

supplying a test current to the galvanic isolator for a periodic test interval after reaching a predetermined count value;

indirectly measuring the amount of test current flowing between the galvanic isolator and shore ground;

comparing the amount of test current flowing between the galvanic isolator and the shore ground during the test interval to a predetermined acceptable range;

activating an alarm if the amount of test current passing through the galvanic isolator during the test interval is outside of the predetermined acceptable range;

inhibiting the alarm at times other than during the test interval to prevent the alarm from being activated during normal operation of the galvanic isolator;

continuously determining whether current is flowing through the galvanic isolator; and preventing the supply of test current to the galvanic isolator upon a determination that current is flowing through the galvanic isolator.

22. The method of claim 21 wherein the test interval is one cycle of the shore power supply.

23. The method of claim 21 wherein the method of measuring the current flowing between the galvanic isolator and shore ground includes placing a toroid around the wire between the galvanic isolator and shore ground.

* * * * *